(12) United States Patent
Jung (10) Patent No.: US 6,593,786 B2
(45) Date of Patent: Jul. 15, 2003

(54) REGISTER CONTROLLED DLL REDUCING CURRENT CONSUMPTION

(75) Inventor: Hea-Suk Jung, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/180,528

(22) Filed: Jun. 27, 2002

(65) Prior Publication Data

US 2003/0001637 A1 Jan. 2, 2003

(30) Foreign Application Priority Data

Jun. 30, 2001 (KR) ........................................ 2001-38871

(51) Int. Cl.$^7$ ................................................ H03L 7/06
(52) U.S. Cl. ........................................ 327/158; 327/153
(58) Field of Search ................................ 327/141, 152, 327/153, 149, 158, 156, 161, 236; 375/373, 376

(56) References Cited

U.S. PATENT DOCUMENTS

| | | | |
|---|---|---|---|
| 5,796,673 A | 8/1998 | Foss et al. ................ | 327/141 |
| 5,901,190 A | 5/1999 | Lee .......................... | 375/373 |
| 5,969,551 A | 10/1999 | Fujioka ..................... | 327/149 |
| 6,140,854 A | 10/2000 | Coddington et al. ...... | 327/158 |
| 6,147,527 A | 11/2000 | Lee et al. ................. | 327/141 |
| 6,157,238 A | 12/2000 | Na et al. .................. | 327/297 |
| 6,262,921 B1 * | 7/2001 | Manning .................. | 365/194 |
| 6,342,796 B2 * | 1/2002 | Jung ......................... | 327/141 |
| 6,433,597 B2 * | 8/2002 | Jung ......................... | 327/158 |

FOREIGN PATENT DOCUMENTS

| | | |
|---|---|---|
| JP | 08-167890 | 6/1996 |
| JP | 11-027116 | 1/1999 |
| JP | 11-261408 | 9/1999 |
| JP | 2000-065902 | 3/2000 |
| JP | 2000-124796 | 4/2000 |

* cited by examiner

*Primary Examiner*—Timothy P. Callahan
*Assistant Examiner*—Linh Nguyen
(74) *Attorney, Agent, or Firm*—Birch, Stewart, Kolasch & Birch, LLP (57) ABSTRACT

A delay locked loop (DLL) usable in a semiconductor memory device and capable of reducing current consumption by operating the DLL loop when the semiconductor device is only at an operation mode, is provided. The semiconductor device includes a clock divider for producing a divided clock signal by dividing an internal clock signal, synchronized with an edge of an external clock signal; a clock generator for producing a reference clock signal, wherein the reference clock signal is activated after a half period of the external clock signal; a delay model for delaying the divided clock signal to compensate for a delay time in delay paths of the internal clock signal; a comparator for comparing a phase difference between the reference clock signal and an output signal from the delay model; a delay unit having a plurality of unit delayers; and a controller for controlling an amount of delay in the internal clock signal and the divided clock signal via the delay unit in response to a phase comparison signal from the comparator.

18 Claims, 4 Drawing Sheets

REGISTER CONTROLLED DLL REDUCING CURRENT CONSUMPTION

The present application claims the priority benefit of Korean Patent Application No. 2001-38871 filed Jun. 30, 2001, under 35 U.S.C. §119, and the contents of the Korean Patent Application are herein fully incorporated by reference.

BACKGROUND OF THE INVENTION

1. Field of the Invention

The present invention relates to a delay locked loop (DLL) in a semiconductor memory device and, more particularly, to a resister controlled DLL capable of reducing current consumption by operating the DLL loop when the semiconductor device is only at an operation mode.

2. Discussion of the Related Art

Generally, in system circuits of semiconductor devices, a clock signal has been used as a reference clock signal for adjusting operation timing or guaranteeing a high-speed operation without an error. When a clock signal from an external circuit is used in an internal circuit, a time delay (or clock skew) is generated. A DLL has been used to compensate for such a time delay by providing the same phase between the external and internal clock signals. As compared with the phase locked loop (PLL), the DLL has an advantage in that it is less sensitive to a noise than the PLL. Accordingly, the DLL has been widely used in synchronous memories such as DDR SDRAMs (Double Data Rate Synchronous DRAMs). A register controlled DLL has been generally used as a DLL circuit.

Figure 1:
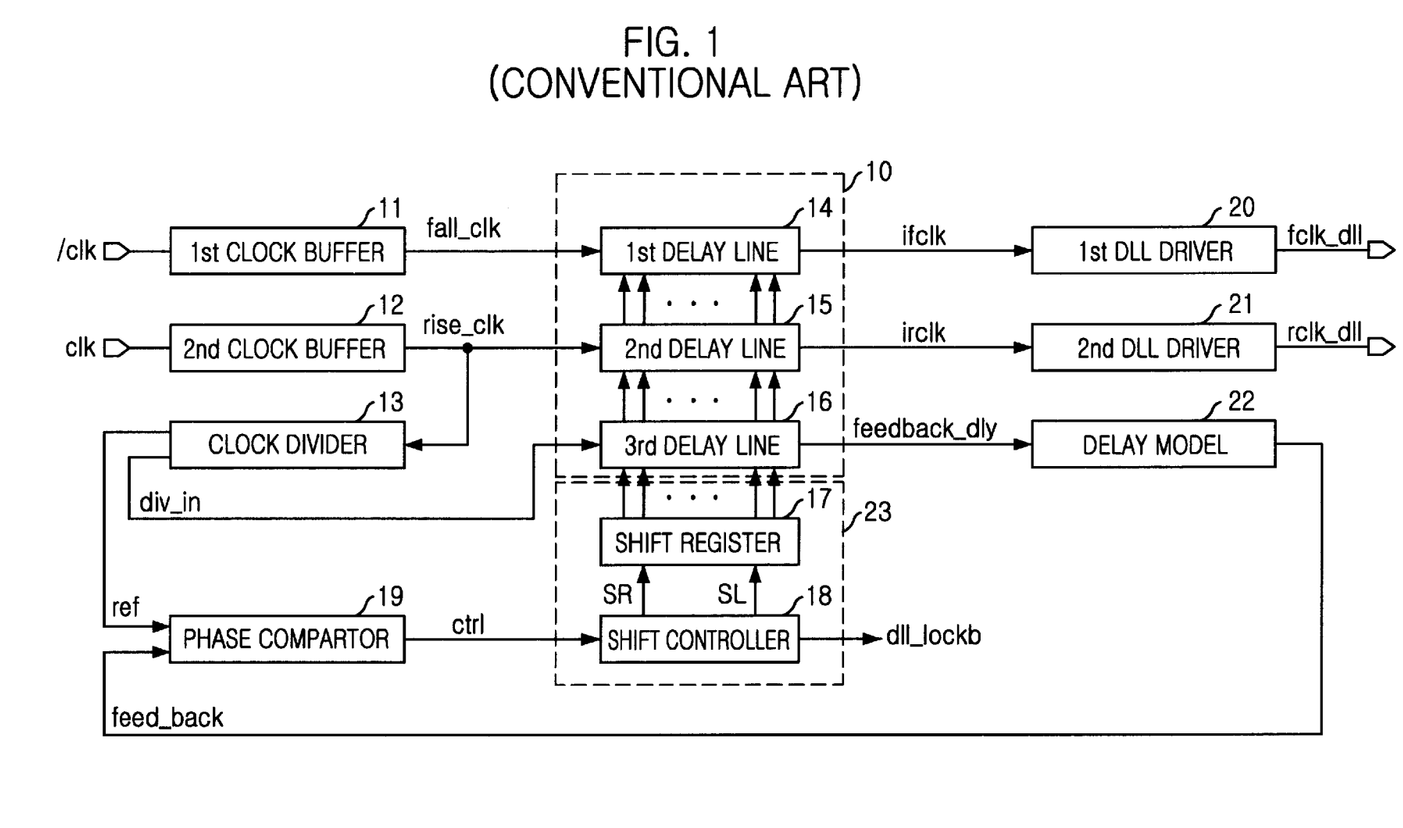
FIG. 1 is a block diagram illustrating a register controlled DLL of a conventional DDR SDRAM.

Referring to FIG. 1, a conventional register controlled DLL includes first and second clock buffers 11 and 12, a clock divider 13, a phase comparator 19, a delay unit 10 which has first to third delay lines 14 to 16, a delay monitor 23 having a shift register 17 and a shift controller 18 in a DLL loop, first and second DLL drivers 20 and 21, and a delay model 22.

The first clock buffer 11 receives an inverted external clock signal /clk and produces a first clock signal fall_clk which is synchronized with a falling edge of the clock signal clk (or a rising edge of the clock signal /clk). Likewise, the second clock buffer 12 receives the external clock signal clk and produces a second clock signal rise_clk which is synchronized with a rising edge of the clock signal clk. The clock divider 13 divides the second clock signal rise_clk into N (N: a positive integer, typically N=8) signals and then produces a reference clock signal ref and a divided clock signals div_in.

The first delay line 14 in the delay unit 10 receives and delays the first clock signal fall_clk according to an amount of delay from the shift register 17, which is controlled by the shift controller 18, and produces a first internal clock signal ifclk. Also, the second delay line 15 receives the second clock signal rise_clk according to an amount of delay from the shift register 17, which is also controlled by the shift controller 18,) and produces a second internal clock signal irclk. The first and second DLL drivers 20 and 21 receive the first and second internal clock signals ifclk and irclk and produce first and second DLL clock signals fclk_dll and rclk_dll, respectively. The third delay line 16 receives the divided clock signal div_in from the clock divider 13 and produces a delayed clock signal feedback_dly. The delay model 22 receiving the delayed clock signal feedback_dly provides the same signal processing path to the delayed clock signal feedback_dly as the actual signal processing.

The phase comparator 19 compares phases of the output signal (feed_back) from the delay model 22 with the reference clock signal ref and provides a control signal ctrl to the shift controller 18 according to the phase difference. The shift controller 18 outputs a right or left shift signal SR or SL to the shift register 17 in response to the control signal ctrl, and the first to third delay lines 14 to 16 shift the input clock signals (e.g., fall_clk and rise_clk) based on the amount of shifting stored in the shift register 17. Also, the shift controller 18 outputs a DLL locking signal dll_lockb when there is no phase difference between the output signal from the delay model 22 and the reference clock signal ref. The delay model 22 includes a dummy clock buffer, a dummy output buffer and a dummy load, which is called a replica circuit. The shift register 17 and the shift controller 18 form the delay monitor 23 used to control the first to third delay lines 14 to 16 within the delay unit 10.

The conventional register controlled DLL of FIG. 1 produces two divided clocks in order to compensate for a phase difference between the first and second clock signals fall_clk and rise_clk through the clock divider 13. That is, the clock divider 13 receives the second clock signal rise_clk and produces the reference clock signal ref and the divided clock signal div_in, each of which has a pulse width of tCK, whenever an N-th division clock signal is generated. The reference clock signal ref and the divided clock signal div_in are out of phase and the reference clock signal ref has a rising edge after tCK from a rising edge of the divided clock signal div_in. The phase of the reference clock signal ref generated after the time of tCK is compared with the delayed clock signal feedback_dly, which is produced by the delay unit 10 and the delay model 22. The control signal ctrl, which is produced by the result of the phase comparison, is input into the shift controller 18 to control the amount of the delay.

Figure 2:
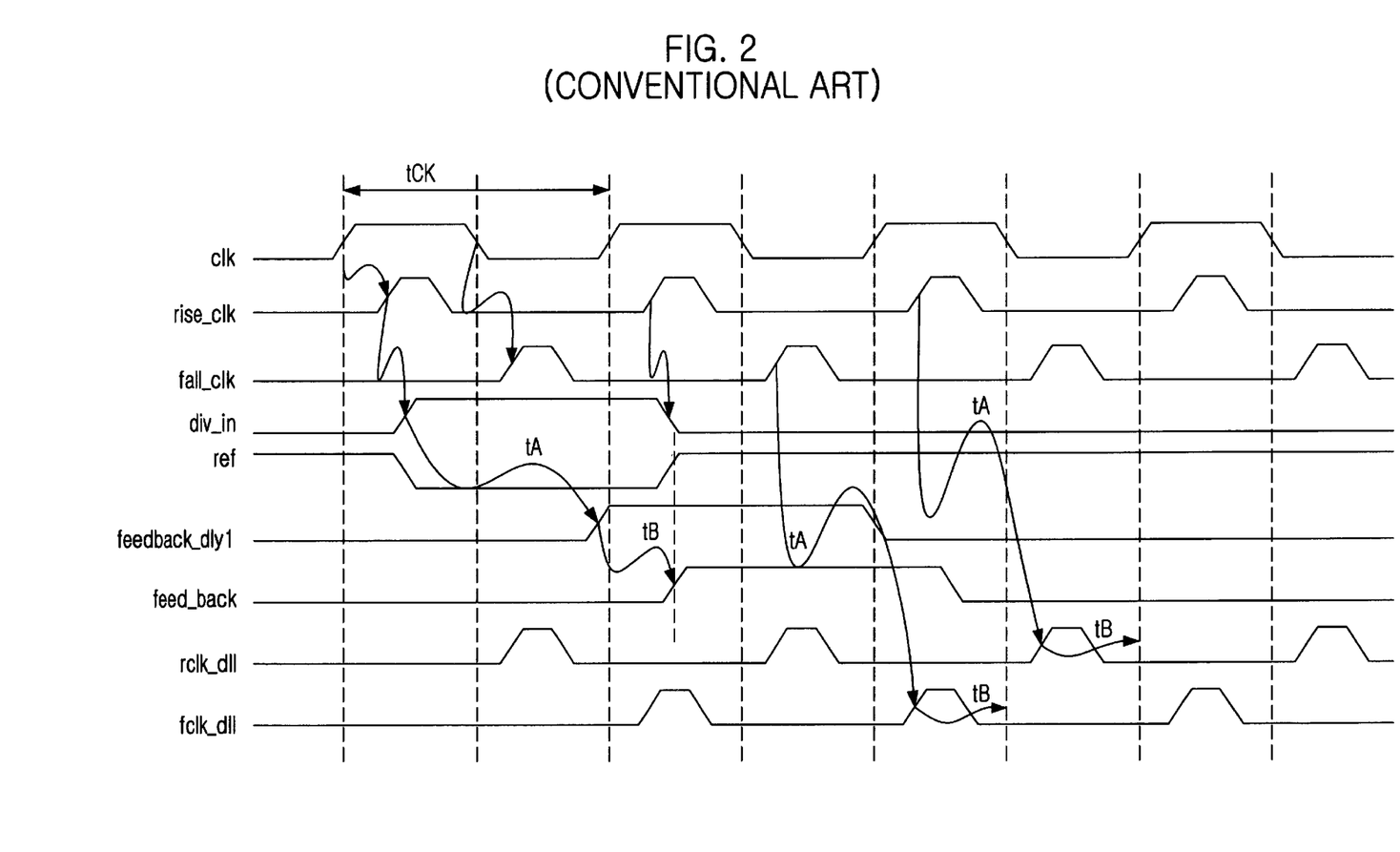
FIG. 2 is a timing chart showing DLL clock waveforms for the device in FIG. 1.

Referring to FIG. 2, the divided clock signal div_in is initially delayed by a unit delay time (for convenience sake, unit delay time tD is 0.1 ns) in a unit delay element and then this is outputted as a delayed clock signal feedback_dly. The delayed clock signal feedback_dly is further delayed by a delay time (for convenience sake, this delay time tB is 3 ns) in the delay model 22 and then outputted as a delayed feedback signal feed_back. Since the initial delayed feedback signal feed_back passes through the unit delay element and the delay model 22, the initial delayed feedback signal feed_back has a rising edge rising 3.1 ns after the rising of the edge of the divided clock signal div_in.

On the other hand, since there is a time difference between the reference clock signal ref and the divided clock signal div_in, if tCK is 15 ns, then the rising edge of the reference clock signal ref lags behind the delayed feedback signal feed_back by 11.9 ns (tCK−(tD+tB)=15 ns−3.1 ns=11.9 ns) in their phases. That is, such a phase difference, which is caused by the delay line, has to be compensated by 12 ns (tCK−tB=15 ns−3 ns=tA (12 ns))

in order that the divided clock signal div_in has the same phase as the reference clock signal ref. In this case, 120 (12 ns/0.1 ns) unit delay lines are needed to compensate for the phase difference of 12 ns using a unit delay time of 0.1 ns thereof. Accordingly, the first clock signal fall_clk and the second clock signal rise_clk must pass through the number of required 120 unit delay lines in order to produce appropriate first and second DLL clock signals fclk_dll and rclk_dll, respectively.

As stated above, the conventional register controlled DLL requires a large number of unit delay lines to compensate for the phase difference between the reference clock signal ref and the divided clock signal div_in. As a result, a significant amount of time is required to make the phase locking and a large amount of current is consumed with the increase of chip size of the unit delay lines.

SUMMARY OF THE INVENTION

It is, therefore, an object of the present invention to provide a register controlled delay locked loop (DLL) capable of decreasing the number of required delay lines, and to provide a semiconductor memory device having the DLL.

It is another object of the present invention to provide a register controlled delay locked loop (DLL) capable of reducing current consumption by using a small number of unit delay lines, and to provide a semiconductor memory device having the DLL.

In accordance with an aspect of the present invention, there is provided a semiconductor device having a register controlled delay locked loop (DLL) and an internal circuit synchronized with a DLL clock signal outputted from the register controlled DLL, the semiconductor device comprising: clock dividing means for producing a divided clock signal by dividing an internal clock signal, which is synchronized with an edge of an external clock signal; clock generation means for producing a reference clock signal, wherein the reference clock signal is activated after a half period of the external clock signal; a delay model for delaying the divided clock signal to compensate delay time in delay paths of the internal clock signal; comparison means for comparing a phase difference between the reference clock signal and an output signal from the delay model; delay unit having a plurality of unit delayers; and control means for controlling an amount of delay of the internal clock signal and the divided clock signal via the delay unit in response to a phase comparison signal from the comparison means.

In accordance with another aspect of the present invention, there is provided a semiconductor device having a register controlled delay locked loop (DLL) and an internal circuit synchronized with a DLL clock signal outputted from the register controlled DLL, the semiconductor device comprising: first internal clock generation means receiving an external clock signal and producing a first internal clock signal which is generated in response to a falling edge of the external clock signal; a second internal clock generation means receiving an external clock signal and producing a second internal clock signal which is generated in response to a rising edge of the external clock signal; first clock dividing means for producing a divided clock signal by dividing one of the first and second internal clock signals, being synchronized with the first internal clock signal; second clock dividing means for producing a reference clock signal by dividing the other of the first and second internal clock signals, being synchronized with the second internal clock signal; a delay model for delaying the divided clock signal to compensate delay time in delay paths of the internal clock signal; comparison means for comparing a phase difference between the reference clock signal and an output signal from the delay model; and delay unit having a plurality of unit delayers; and control means for controlling an amount of delay of the first and second internal clock signals and the divided clock signal via the delay unit in response to a phase comparison signal from the comparison means.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Hereinafter, a register controlled DLL in DDR SDRAM devices according to the present invention will be described in detail in reference with the accompanying drawings.

Figure 3:
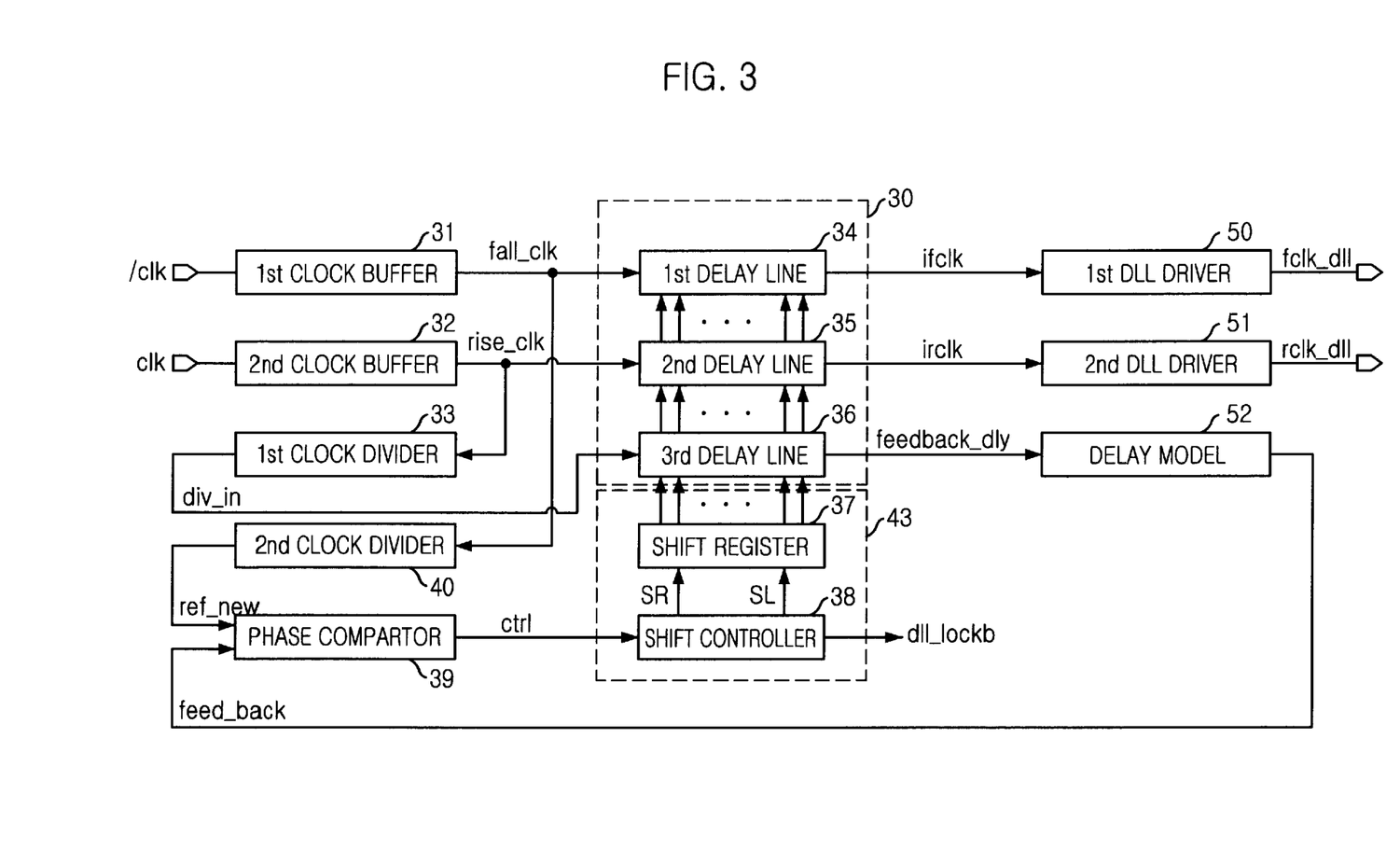
FIG. 3 is a block diagram illustrating a register controlled DLL of a DDR SDRAM in accordance with an embodiment of the present invention.

Referring to FIG. 3, the register controlled DLL according to an embodiment of the present invention includes first and second clock buffers 31 and 32, first and second clock dividers 33 and 40, a phase comparator 39, a delay unit 30 including first to third delay lines 34 to 36, a delay monitor 43 having a shift register 37 and a shift controller 38 in a DLL loop, first and second DLL drivers 50 and 51, and a delay model 52, all operatively coupled. Each of the delay lines 34, 35 and 36 includes a predetermined number of unit delayers. The device as shown in FIG. 3 has the same configuration as the one shown in FIG. 1, except for the addition of the second clock divider 40 and connection changes resulting therefrom.

The first clock buffer 31 receives an inverted external clock signal /clk and produces a first clock signal fall_clk with a certain pulse width in response to a falling edge of the external clock signal clk (or a rising edge of the inverted external clock signal /clk) Likewise, the second clock buffer 32 receives the external clock signal clk and produces a second clock signal rise_clk with a certain pulse width in response to a rising edge of the external clock signal clk. The first clock divider 33 divides the second clock signal rise_clk into N (N: a positive integer, typically N=8) signals and thereby produces a divided clock signal div_in which is output as a delayed clock signal.

The first delay line 34 of the delay unit 30 receives the first clock signal fall_clk and delays it according to an amount of delay in the shift register 37, which is controlled by the shift controller 38, thereby producing a first internal clock signal ifclk. The second delay line 35 receives the second clock signal rise_clk and delays it according to an amount of delay in the shift register 37, which is also controlled by the shift controller 38, thereby producing a second internal clock signal irclk. The first and second DLL drivers 50 and 51 receive the first and second internal clock signals ifclk and irclk and produce first and second DLL clock signals fclk_dll and rclk_dll, respectively. The third delay line 36 receives the divided clock signal div_in from the first clock divider 33 and produces a delayed clock signal feedback_dly. The delay model 52 performs on the delayed clock signal feedback_dly the same signal processing that the second clock buffer 32 performs on the external clock signal clk, and thereby outputs a delayed clock signal feed_back. That is, the delay model 52, which is called a replica circuit, includes a dummy clock buffer, a dummy output buffer and a dummy load.

On the other hand, the present invention further provides the register controlled DLL with the second clock divider 40 receiving the first clock signal fall_clk. The second clock divider 40 divides the first clock signal fall_clk and thereby outputs a divided clock signal as a reference clock signal ref_new. The phase comparator 39 compares the phase difference between the output signal feed_back from the delay model 52 with the reference clock signal ref_new and provides an appropriate control signal ctrl to the shift controller 38 according to the phase difference. The shift controller 38 outputs a right or left shift signal SR or SL to the shift register 37 in response to the control signal ctrl. The first to third delay lines 34 to 36 shift the input clock signals (e.g., fall_clk, rise_clk and div_in) based on the amount of shift stored in the shift register 37. Also, the shift controller 38 outputs a DLL locking signal dll_lockb when there is no phase difference between the output signal (feedback signal) feed_back from the delay model 53 and the reference clock signal ref_new. The shift register 37 and the shift controller 38 form the delay monitor 43 that is used to control the first to third delay lines 34 to 36 within the delay unit 30.

Figure 4:
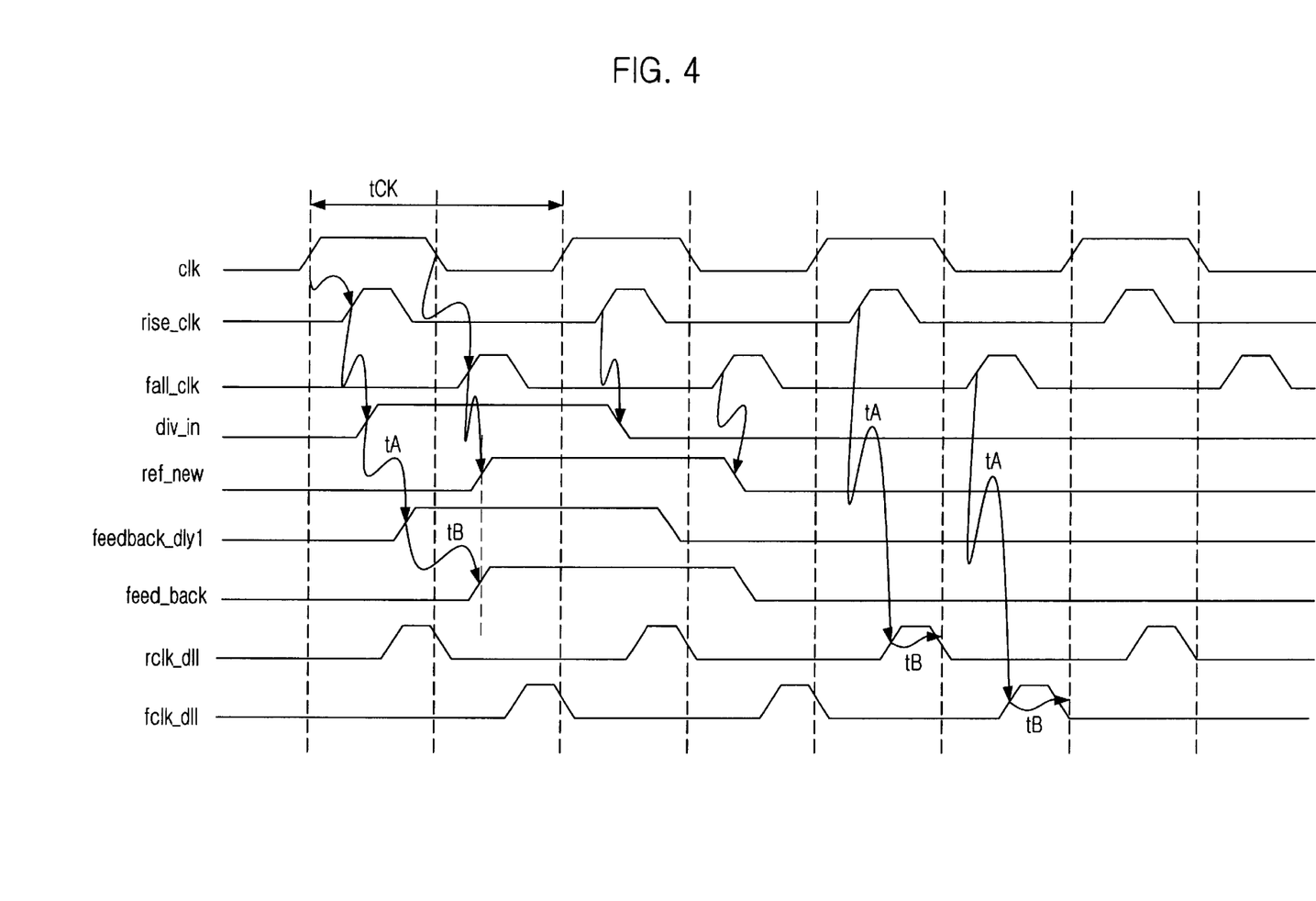
FIG. 4 is a timing chart of the register controlled DLL of the DDR SDRAM in FIG. 3.

Referring to FIGS. 3 and 4, the first clock buffer 31 receiving the inverted external clock signal /clk produces the first clock signal fall_clk in response to the falling edge of the external clock signal clk (or rising edge of the inverted external clock signal /clk). The second clock buffer 32 receiving the external clock signal clk produces the second clock signal rise_clk in response to the rising edge of the external clock signal clk (or the falling edge of the inverted external clock signal /clk). The first clock divider 33 receives the second clock signal rise_clk, divides the second clock signal rise_clk into N signals, and then produces the divided clock signal $div_{13}$ in (or monitoring clock signal) whenever an N-th division clock signal is generated. The second clock divider 40 receives the first clock signal fall_clk, divides it into N signals, and then produces the reference clock signal ref_new whenever an N-th division clock signal is generated. In these cases, N is a positive integer, e.g., 8.

Each of the divided clock signal div_in and the reference clock signal ref_new has the same pulse width (tCK) as the external clock signal clk, and the reference clock signal ref_new rises after tCK/2 of the rising of the divided clock signal div_in. At the initial operation, the divided clock signal div_in passes through the third delay line 36 in the delay unit 30 and is outputted as the delayed clock signal feedback_dly. The delayed clock signal feedback_dly passes through the delay model 52 to produce the feedback signal feed_back, which is applied to the phase comparator 39. Accordingly, the feedback signal feed_back legs behind the delayed clock signal feedback_dly by tB.

The phase comparator 39 compares the rising edge of the reference clock signal ref_new with the rising edge of the feedback signal feed_back and thereby produces the control signal ctrl. The shift controller 38 generates the right and left shift control signals SR and SL to control the shift direction of the shift register 37 in response to the control signal ctrl. The shift register 37 determines an amount of delay in each of the first to third delay lines 34 to 36 in response to the right or left shift control signal SR or SL. At this time, if the right shift control signal SR is outputted to the shift register 37, the input signals, which are inputted to the first to third delay lines 34 to 36, are right shifted. In the same manner, if the left shift control signal SL is outputted to the shift register 37, the input signals, which are inputted to the first to third delay lines 34 to 36, are left shifted.

Comparing the reference clock signal ref_new with the feedback signal feed_back in which an amount of delay is controlled, the DLL locking is achieved when the jitter between these two signals is a minimum value. When DLL locking is achieved, the DLL locking signal dll_lockb is outputted by the shift controller 38 so that the first and second DLL drivers 50 and 51 are driven to obtain the DLL clock signals fclk_dll and rclk_dll. At this time, the DLL clock signals fclk_dll and rclk_dll and the external clock signal clk have the same phase as desired.

As mentioned above, the register controlled DLL according to the present invention employs two clock dividers 33 and 40 to compensate for the time difference between the external clock signal clk and the internal clock signals rise_clk and fall_clk. The first clock divider 33 receives the second clock signal rise_clk, which is generated in response to the rising edge of the external clock signal clk, and produces the delayed monitoring clock signal (the divided clock signal div_in), which has a pulse width of tCK, every N divided clock signals. Also, the second clock divider 40 receives the first clock signal fall_clk, which is generated in response to the falling edge of the external clock signal clk, and produces the reference clock signal (a divided clock signal) ref_new, which has a pulse width of tCK, every N divided clock signals. Since the reference clock signal ref_new has a rising edge after tCK/2 from the rising edge of the divided clock signal div_in, the phase difference in the phase comparator 39 between the feedback signal feed_back, which passes through the third delay line 36 and the delay model 52, and the reference clock signal ref_new can be reduced.

The divided clock signal div_in is delayed by a unit delay time via a unit delay element (tD where, e.g., tD=0.1 ns) and then the delayed clock signal of the divided clock signal div_in is outputted as the delayed clock signal feedback_dly. This delayed clock signal feedback_dly is delayed again in the delay model 52 (tB where, e.g., tB=3 ns), thereby forming the feedback signal feed_back. At the initial time, the feedback signal feed_back has a rising edge after 3.1 ns from the rising edge of the divided clock signal dive_in because it passes through the unit delay element and the dely model 52.

Since the phase difference between the reference clock signal ref_new and the divided clock signal div_in is tCK/2 as shown in FIG. 4, the reference clock signal ref_new legs behind the feedback signal feed_back by 4.4 ns $$(tCk/2-(tD+tB)=7.5 \ ns-3.1 \ ns=4.4 \ ns)$$

in the case where tCK is 15 ns. That is, in order for the divided clock signal div_in to have the same phase as the reference clock signal ref_new, such a phase difference $$(tCK/2(7.5 \ ns)-tB(3 \ ns)=tA(4.5 \ ns))$$

should be compensated in the third delay line 36. Accordingly, only 45 unit delayers, each of which has 0.1 ns-delay time, are required to compensate for the phase difference (4.5 ns) in this example. As a result, the first and second delay lines 34 and 35, which respectively delay the first and second clock signals fall_clk and rise_clk, should each have the 45 unit delayers, respectively. As compared to the conventional register controlled DLL in FIG. 1, which requires 120 delay units per delay line for tcK=15 ns, the register controlled DLL according to one example of the present invention requires only 45 delay units per delay line, and thus the present invention reduces the number of unit delayers required significantly.

Although the above embodiment is illustrated in the DLL of the DDR SDRAM, the present invention is applicable to other synchronization memory devices and logic devices having the resister controlled DLL. Also, in the above embodiment, the reference clock signal ref_new is produced by the second clock divider 40 receiving the first clock signal fall_clk and the divided clock signal div_in is produced by the first clock divider 33 receiving the second clock signal rise_clk. However, it is possible to alter their input signals fall_clk and rise_clk. In other words, the reference clock signal ref_new can be produced by the first clock divider 33 receiving the second clock signal rise_clk and the divided clock signal div_in can be produced by the second clock divider 40 receiving the first clock signal fall_clk. Further, one of the clock dividers 33 and 40 can be substituted with a clock generator to produce a clock which has a phase difference of tCK/2 with the same pulse width.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device having a register controlled delay locked loop (DLL) and an internal circuit synchronized with a DLL clock signal outputted from the register controlled DLL, the semiconductor device comprising:
    a clock divider producing a divided clock signal by dividing an internal clock signal generated in response to an external clock signal;
    a clock generator producing a reference clock signal, wherein the reference clock signal is activated after a half period of the external clock signal;
    a delay model delaying the divided clock signal to compensate for a delay time in delay paths of the internal clock signal;
    a comparison unit comparing a phase difference between the reference clock signal and an output signal from the delay model and thereby generating a phase comparison signal;
    a delay unit having a plurality of unit delayers; and
    a controller controlling an amount of delay of the internal clock signal and the divided clock signal via the delay unit in response to the phase comparison signal from the comparison unit.

2. The semiconductor device as recited in claim 1, further comprising:
    a DLL driver driving a delay controlled internal clock signal in response to a locking signal generated from the controller.

3. The semiconductor device as recited in claim 1, wherein the delay unit includes:
    a first delay line having a plurality of unit delayers for delaying the internal clock signal in response to a control signal from the controller; and
    a second delay line having a plurality of unit delayers for delaying the divided clock signal in response to a control signal from the controller.

4. The semiconductor device as recited in claim 1, further comprising:
    first and second clock buffers generating respectively first and second internal clock signals in response to the external clock signal, wherein the clock divider and the clock generator respectively receive the second and first internal clock signals and thereby produce the divided clock signal and the reference clock signal, respectively.

5. A logic device having a register controlled delay locked loop (DLL) and an internal circuit synchronized with a DLL clock signal outputted from the register controlled DLL, the logic device comprising:
    a clock divider producing a divided clock signal by dividing an internal clock signal, the internal clock signal generated in response to an external clock signal;
    a clock generator producing a reference clock signal, wherein the reference clock signal is activated after a half period of the external clock signal;
    a delay model delaying the divided clock signal to compensate for a delay time in delay paths of the internal clock signal;
    a comparison unit comparing a phase difference between the reference clock signal and an output signal from the delay model and thereby generating a phase comparison signal;
    a delay unit having a plurality of unit delayers; and
    a controller controlling an amount of delay of the internal clock signal and the divided clock signal via the delay unit in response to the phase comparison signal from the comparison means.

6. The logic device as recited in claim 5, further comprising:
    a DLL driver driving a delay controlled internal clock signal in response to a locking signal generated from the controller.

7. The logic device as recited in claim 5, wherein the delay unit includes:
    a first delay line having a plurality of unit delayers for delaying the internal clock signal in response to a control signal from the controller; and
    a second delay line having a plurality of unit delayers for delaying the divided clock signal in response to a control signal from the controller.

8. The logic device as recited in claim 5, further comprising:
    first and second clock buffers generating respectively first and second internal clock signals in response to the external clock signal, wherein the clock divider and the clock generator respectively receive the second and first internal clock signals and thereby produce the divided clock signal and the reference clock signal, respectively.

9. A semiconductor device having a register controlled delay locked loop (DLL) and an internal circuit synchronized with a DLL clock signal outputted from the register controlled DLL, the semiconductor device comprising:
    a first internal clock generator receiving an inverted form of an external clock signal and producing a first internal clock signal in response to a falling edge of the external clock signal;
    a second internal clock generator receiving the external clock signal and producing a second internal clock signal in response to a rising edge of the external clock signal;

a first clock divider producing a divided clock signal by dividing one of the first and second internal clock signals;

a second clock divider producing a reference clock signal by dividing the other one of the first and second internal clock signals;

a delay model delaying the divided clock signal to compensate for a delay time in a delay path of at least one of the first and second internal clock signals;

a comparator comparing a phase difference between the reference clock signal and an output signal from the delay model and thereby generating a phase comparison signal;

a delay unit having a plurality of unit delayers; and a controller controlling an amount of delay of the first and second internal clock signals and the divided clock signal via the delay unit in response to the phase comparison signal from the comparator.

10. The semiconductor device as recited in claim 9, wherein a rising edge of the divided clock signal is synchronized with a rising edge of the second internal clock signal.

11. The semiconductor device as recited in claim 9, wherein a rising edge of the reference clock signal is synchronized with a rising edge of the first internal clock signal.

12. The semiconductor device as recited in claim 9, further comprising:

a DLL driver driving a delay controlled internal clock signal in response to a locking signal from the controller.

13. The semiconductor device as recited in claim 9, wherein the delay unit includes:

a first delay line having a plurality of unit delayers for delaying the first internal clock signal in response to a control signal from the controller;

a second delay line having a plurality of unit delayers for delaying the second internal clock signal in response to a control signal from the controller; and a third delay line having a plurality of unit delayers for delaying the divided clock signal in response to a control signal from the controller.

14. A logic device having a register controlled delay locked loop (DLL) and an internal circuit synchronized with a DLL clock signal outputted from the register controlled DLL, the logic device comprising:

a first internal clock generator receiving an external clock signal and producing a first internal clock signal in response to a falling edge of the external clock signal;

a second internal clock generator receiving an external clock signal and producing a second internal clock signal in response to a rising edge of that external clock signal;

a first clock divider producing a divided clock signal by dividing one of the first and second internal clock signals;

a second clock divider producing a reference clock signal by dividing the other one of the first and second internal clock signals;

a delay model delaying the divided clock signal to compensate for a delay time in a delay path of at least one of the first and second internal clock signals;

a comparator comparing a phase difference between the reference clock signal and an output signal from the delay model and thereby generating a phase difference signal;

a delay unit having a plurality of unit delayers; and a controller controlling an amount of delay of the first and second internal clock signals and the divided clock signal via the delay unit in response to the phase comparison signal from the comparator.

15. The logic device as recited in claim 14, wherein a rising edge of the divided clock signal is synchronized with a rising edge of the second internal clock signal.

16. The logic device as recited in claim 14, wherein a rising edge of the reference clock signal is synchronized with a rising edge of the first internal clock signal.

17. The logic device as recited in claim 14, further comprising:

at least one DLL driver driving a delay controlled internal clock signal in response to a locking signal from the controller.

18. The logic device as recited in claim 14, wherein the delay unit includes:

a first delay line having a plurality of unit delayers for delaying the first internal clock signal in response to a control signal from the controller;

a second delay line having a plurality of unit delayers for delaying the second internal clock signal in response to a control signal from the controller; and a third delay line having a plurality of unit delayers for delaying the divided clock signal in response to a control signal from the controller.

* * * * *

UNITED STATES PATENT AND TRADEMARK OFFICE
CERTIFICATE OF CORRECTION

PATENT NO. : 6,593,786 B2
DATED : June 24, 2003
INVENTOR(S) : Georg Baumann

It is certified that error appears in the above-identified patent and that said Letters Patent is hereby corrected as shown below:

<u>Column 11,</u>
Line 9, "m" should read -- in --.

Signed and Sealed this

Thirtieth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,593,786 B2
DATED : July 15, 2003
INVENTOR(S) : Hea-Suk Jung It is certified that error appears in the above-identified patent and that said Letters Patent is hereby corrected as shown below:

This certificate supersedes Certificate of Correction issued September 30, 2003, the number was erroneously mentioned and should be vacated since no Certificate of Correction was granted.

Signed and Sealed this

Eleventh Day of November, 2003

JAMES E. ROGAN
*Director of the United States Patent and Trademark Office*